United States Patent [19]

Shingu et al.

[11] Patent Number: 5,995,669
[45] Date of Patent: Nov. 30, 1999

[54] IMAGE PROCESSING METHOD AND APPARATUS

[75] Inventors: Toshiaki Shingu, Kawasaki; Hiroshi Inoue, Yokohama; Masaaki Imaizumi, Tokyo, all of Japan

[73] Assignee: Canon Kabushiki Kaisha, Tokyo, Japan

[21] Appl. No.: 08/755,227

[22] Filed: Nov. 22, 1996

[30] Foreign Application Priority Data

Dec. 8, 1995 [JP] Japan ..................................... 7-320412

[51] Int. Cl.$^6$ ....................................................... G06K 9/36
[52] U.S. Cl. .......................... 382/237; 382/162; 382/156; 395/109; 706/42
[58] Field of Search ..................................... 382/162, 237, 382/251, 252, 156, 157; 395/27, 109; 706/42

[56] References Cited

U.S. PATENT DOCUMENTS 5,253,330 10/1993 Ramacher et al. ......................... 706/42

FOREIGN PATENT DOCUMENTS 0461902 12/1991 European Pat. Off. ......... G06F 15/80
0606987 7/1994 European Pat. Off. .......... H04N 1/40

OTHER PUBLICATIONS

"Self–Organized Color Image Quantization For Color Image Data Compression", K. Godfrey et al., Proceedings of The International Conference on Neural Networks (ICN, San Francisco, Ca, Mar. 28–Apr. 1, 1993, Vol. 3, Mar. 28, 1993, Institute of Electrical and Electronics Engineering, PP. 1622–1626, XP000379519.

"Multiple Layer Discrete–Time Cellular Neural Networks Using Time–Varient Templates", H. Harrer, IEE Transactions On Circuit and Systems II: Analog and Digital Signal Processing vol. 40, No. 3, Mar. 1, 1993, pp. 191–199, XP000385539.

"Image Halftoning With Cellular Neural Networks" K. Crounse et al. IEEE Transactions On Circuits and Systems II: Analog and Digital Signal Processing, vol. 40, No. 4, Apr. 1, 1993, pp. 267–283, XP0003849862.

"Parallel Analog Image Coding and Decoding By Using Cellular Neural Networks", M. Tanaka, et al., IEICE Transactions On Fundamentals of Elecectronics, Communications and Computer Sciences, vol. E77–A, No. 8, Aug. 1, 1994, pp. 1387–1394, XP000445433.

Primary Examiner—Amelia Au
Assistant Examiner—Samir Ahmed
Attorney, Agent, or Firm—Fitzpatrick, Cella, Harper & Scinto

[57] ABSTRACT

An image processing apparatus includes an input unit for entering a plurality of color image signals, an image processing unit for subjecting the plurality of entered color image signals to processing based upon an algorithm of a cellular neural network, and a comparison decision unit for deciding output color data based upon results of processing by the image processing unit. Since input multivalued color image data based upon the algorithm of a neural network are converted to output color image data, it is possible to obtain a high-quality output color image that is faithful to the input color image.

3 Claims, 13 Drawing Sheets

FIG. 5

| -2 -2 | -1 -2 | 0 -2 | 1 -2 | 2 -2 |
|---|---|---|---|---|
| -2 -1 | -1 -1 | 0 -1 | 1 -1 | 2 -1 |
| -2 0 | -1 0 | 0 0 | 1 0 | 2 0 |
| -2 1 | -1 1 | 0 1 | 1 1 | 2 1 |
| -2 2 | -1 2 | 0 2 | 1 2 | 2 2 |

FIG. 6

$$A = \begin{bmatrix} -0.1353 & -0.2865 & -0.3679 & -0.2865 & -0.1353 \\ -0.2865 & -0.6065 & -0.7788 & -0.6065 & -0.2865 \\ -0.3679 & -0.7788 & -0.0000 & -0.7788 & -0.3679 \\ -0.2865 & -0.6065 & -0.7788 & -0.6065 & -0.2865 \\ -0.1353 & -0.2865 & -0.3679 & -0.2865 & -0.1353 \end{bmatrix}$$

FIG. 7

$$B = \begin{bmatrix} 0.1353 & 0.2865 & 0.3679 & 0.2865 & 0.1353 \\ 0.2865 & 0.6065 & 0.7788 & 0.6065 & 0.2865 \\ 0.3679 & 0.7788 & 1.0000 & 0.7788 & 0.3679 \\ 0.2865 & 0.6065 & 0.7788 & 0.6065 & 0.2865 \\ 0.1353 & 0.2865 & 0.3679 & 0.2865 & 0.1353 \end{bmatrix}$$

FIG. 10

| NO. | r | g | b |
|---|---|---|---|
| 0 | −1.0 | −1.0 | −1.0 |
| 1 | 0.24706 | −1.0 | −1.0 |
| 2 | 0.24706 | 0.24706 | −1.0 |
| 3 | −1.0 | 0.24706 | −1.0 |
| 4 | −1.0 | −1.0 | 0.24706 |
| 5 | 0.24706 | −1.0 | 0.24706 |
| 6 | 0.24706 | 0.24706 | 0.24706 |
| 7 | −1.0 | 0.24706 | 0.24706 |
| 8 | −0.24706 | −0.24706 | −0.24706 |
| 9 | 1.0 | −0.24706 | −0.24706 |
| 10 | 1.0 | 1.0 | −0.24706 |
| 11 | −0.24706 | 1.0 | −0.24706 |
| 12 | −0.24706 | −0.24706 | 1.0 |
| 13 | 1.0 | −0.24706 | 1.0 |
| 14 | 1.0 | 1.0 | 1.0 |
| 15 | −0.24706 | 1.0 | 1.0 |

FIG. 11

| NO. | R | G | B | W |
|---|---|---|---|---|
| 0 | −1.0 | −1.0 | −1.0 | −1.0 |
| 1 | 1.0 | −1.0 | −1.0 | −1.0 |
| 2 | 1.0 | 1.0 | −1.0 | −1.0 |
| 3 | −1.0 | 1.0 | −1.0 | −1.0 |
| 4 | −1.0 | −1.0 | 1.0 | −1.0 |
| 5 | 1.0 | −1.0 | 1.0 | −1.0 |
| 6 | 1.0 | 1.0 | 1.0 | −1.0 |
| 7 | −1.0 | 1.0 | 1.0 | −1.0 |
| 8 | −1.0 | −1.0 | −1.0 | 1.0 |
| 9 | 1.0 | −1.0 | −1.0 | 1.0 |
| 10 | 1.0 | 1.0 | −1.0 | 1.0 |
| 11 | −1.0 | 1.0 | −1.0 | 1.0 |
| 12 | −1.0 | −1.0 | 1.0 | 1.0 |
| 13 | 1.0 | −1.0 | 1.0 | 1.0 |
| 14 | 1.0 | 1.0 | 1.0 | 1.0 |
| 15 | −1.0 | 1.0 | 1.0 | 1.0 |

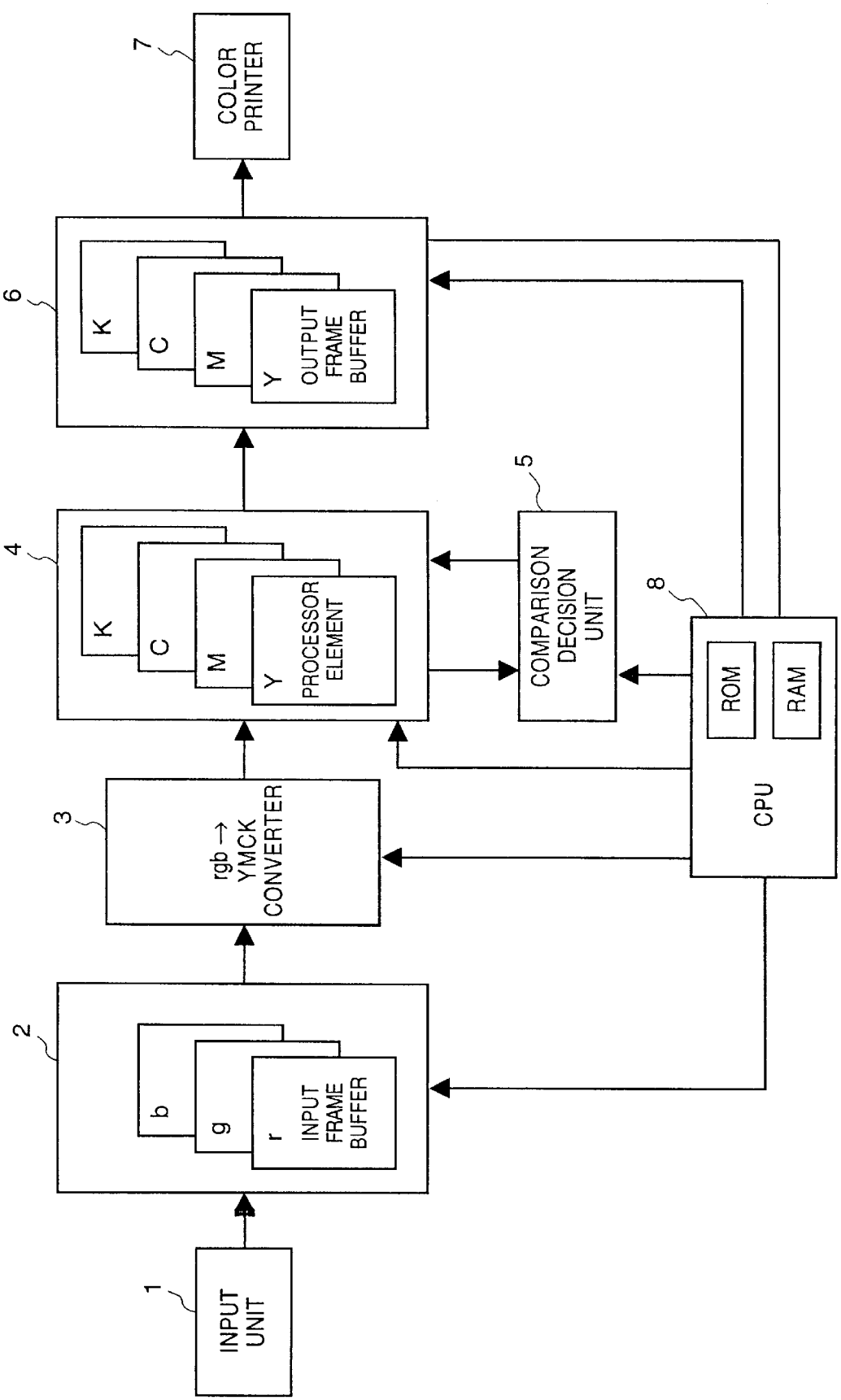

IMAGE PROCESSING METHOD AND APPARATUS

BACKGROUND OF THE INVENTION

1. Field of the Invention

This invention relates to an image processing method and apparatus for subjecting input image data to halftoning processing. More particularly, the invention relates to an image processing method and apparatus for halftoning input color image data based upon the algorithm of a discrete-time cellular neural network (DTCNN).

2. Description of the Related Art

Converting an analog signal of a natural image to a digital signal of a digital halftone image usually is carried out by discretization in the time direction (sampling) and in the magnitude direction (quantization). Such processing results in loss of information. However, if note is taken of the fact that a natural image contains many low-frequency components and exhibits strong correlation in a spatio-temporal neighborhood, a digital halftone image approximating the natural image can be obtained by quantization image processing involving a small number of bits. Quantization image processing involving a small number of bits is processing through which a digital halftone image expressed by a smaller number of bits is formed, by utilizing information in the spatio-temporal neighborhood area, from an analog natural image or from a quantized image consisting of a large number of bits obtained by A/D-converting each gray-level value of the analog natural image independently using an A/D converter that operates on a large number of bits.

The divided pixel digital halftoning has long been used to form a pseudo-digital halftone image. This method entails reproducing the grayscale by changing the percentage of black in a neighborhood image in order to reproduce a gray-level image by a black-and-white bi-level printer or display. Examples of such methods in practical use include the dither method, in which a gray level u(x,y) of the original image is compared with a threshold value T calculated in accordance with a set rule, and the error diffusion method, in which the error between an input gray-level image value and an output halftone image is diffused to pixels that have not yet been scanned.

A well-known technique for forming a full-color image involves halftoning input color image data to a small number of bits (e.g., single-bit bi-level data) using the error diffusion method and forming the full-color image using a bi-level printer or a bi-level display device.

However, in order to obtain a halftone image that approximates an analog natural image using the dither method, the number of bits per pixel must be made fairly large. A problem encountered with the error diffusion method is the blurring of images having sharp edges, such as character images that have been closely sampled. Another problem that arises when the number of bits per pixel is increased is the occurrence of a false contour which undergoes no change whatsoever only in a certain neighborhood.

SUMMARY OF THE INVENTION

Accordingly, an object of the present invention is to provide an image processing method and apparatus in which a high-quality output color image that is faithful to an input color image can be obtained by converting input multivalued color image data to output color image data based upon the algorithm of a neural network.

Another object of the present invention is to provide a color image processing method and apparatus which, by virtue of using digital circuit architecture to construct a neural network, excels in universality, ease of control and ease of integration.

According to the present invention, the foregoing objects are attained by providing an image processing apparatus comprising input means for entering a plurality of color image signals, processing means for subjecting a plurality of entered color image signal to processing based upon an algorithm of a cellular neural network, quantization means for deciding output color data based upon results of processing by the processing means, and output means for outputting a color image based upon results of quantization by the quantization means.

Further, according to the present invention, the foregoing objects are attained by providing an image processing method comprising the steps of entering a plurality of multivalued color image signals, three-dimensionally quantizing the entered plurality of multivalued color image signals using an algorithm of a cellular neural network, and converting the quantized signals to a plurality of bi-level color image signals.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 5 is a diagram for describing a neighborhood system of a pixel of interest for executing a multiply-and-accumulate operation;

FIG. 6 is a diagram illustrating an example of output weighting values;

FIG. 7 is a diagram illustrating an example of input weighting values;

FIG. 10 is a diagram showing an rgb table from FIG. 9;

FIG. 11 is a diagram showing an RGBW table from FIG. 9;

FIG. 16 is a block diagram for a case where the invention is applied to a color printer.

DESCRIPTION OF THE PREFERRED EMBODIMENTS

Figure 1:
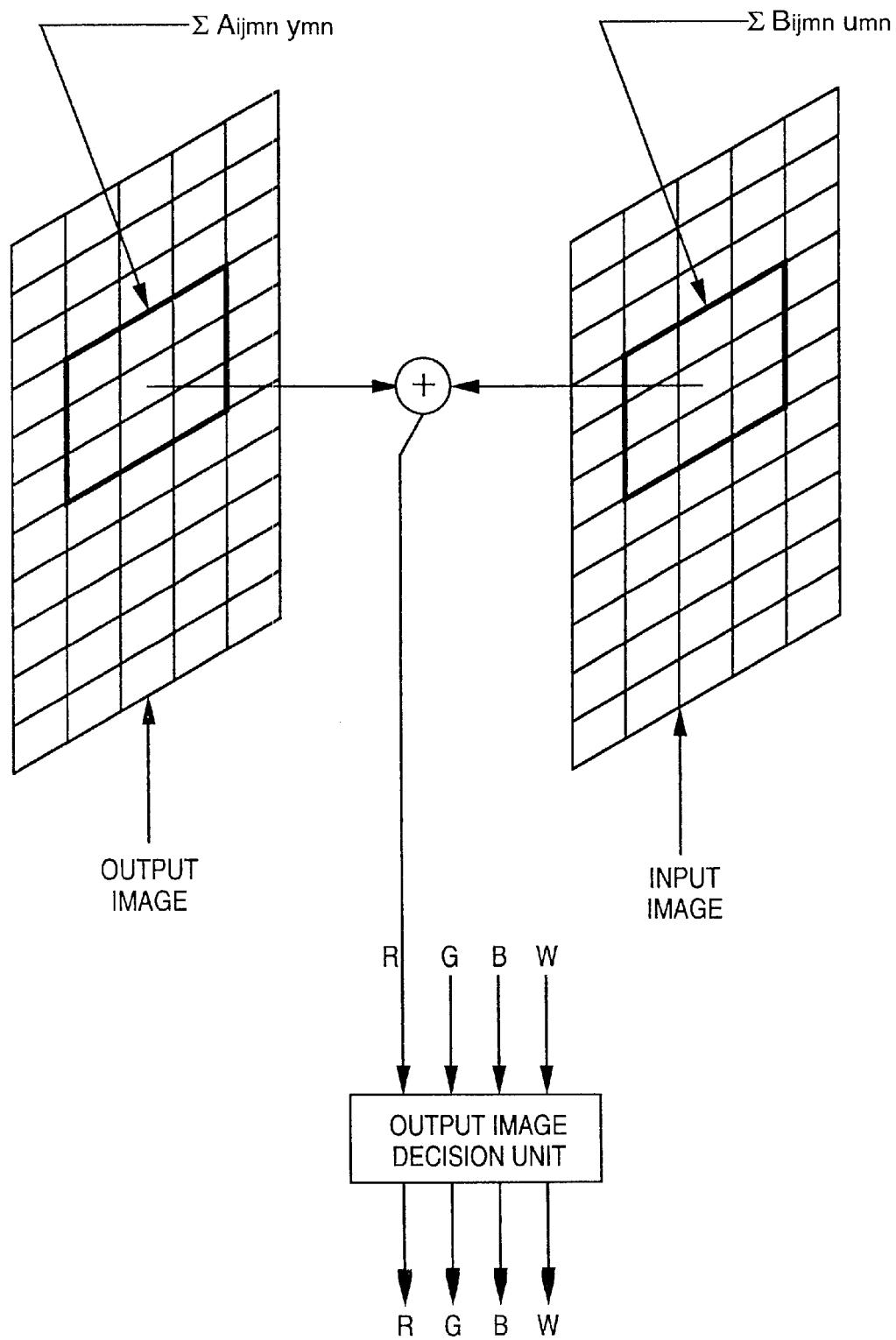
FIG. 1 is a diagram for describing the concept of image processing using a DTCNN in an embodiment of the invention.

Embodiments of the present invention will now be described in detail. The principle of the embodiments will be described first.

The binarization of a gray-level image is extremely important in a bi-level printer or display. Simple binarization wherein an input gray-level pixel value is simply compared with a threshold value is suitable for a case where a character image or edge image is expressed but is inappropriate for expressing natural images. In the case of a natural image, therefore, use is made of an area gradation method such as the error diffusion method which, by utilizing the fact that correlation of a natural image is strong in the spatio-temporal neighborhood, reproduces tones by changing the percentage of black in the neighborhood image. This is image processing through which an output halftone image of a small number of bits of each pixel is decided in accordance with raster scanning (i.e., image processing for deciding output images successively with respect to an input image). Though a characterizing feature is high-speed, simple operation, problems in terms of image quality are encountered. This means that finding a new quantization processing method to replace the conventional halftoning method also is important.

Accordingly, in this embodiment, halftoning processing is executed based upon the algorithm of a discrete-time cellular neural network (DTCNN) in such a manner that a halftoned output image will approach an input gray-level image.

Liquid crystal displays have recently become very popular as an alternative to CRTs. In comparison with a CRT, a liquid crystal display can be made thinner and can be made to consume less power. Among these, ferroelectric liquid crystal displays (FLCD, which are at the forefront of recent research, are of particular interest. An FLCD has outstanding features such as quick response and the fact that it lends itself to fabrication of a large-area panel and low cost. Basically, an FLCD constructs each output pixel using only two states, namely light and dark, by two molecular orientations. Accordingly, to express shades of color, it is required that each output pixel value be reproduced at the area ratios of the respective RGB bits. This means that the number of colors that can be displayed is limited. In this case, the limited colors capable of being represented in a display are representative colors obtained by partitioning the RGB color space uniformly. When an image is displayed on such FLCD, the number of displayable colors will be small if each pixel value of the original image is subjected to simple quantization. The result is a displayed image of poor quality. It is necessary, therefore, that the original image be subjected to a quantization conversion that is suitable for display on this display device. Such a quantization conversion expresses the grayscale by changing the proportion of pixel values quantized in a certain neighborhood area. More specifically, if it is so arranged that a weighted sum total of pixel values quantized in a certain neighborhood will be equal to the pixel values of the original image, then, even if this is displayed on a limited-color display, an image close to the original can be made sensible by a human being through use of a human vision filter.

FIG. 1 is a diagram for describing the concept of image processing using a DTCNN in this embodiment of the invention.

In FIG. 1, the product sum $\Sigma B_{ijmn} U_{mn}$ of input gray-level images in a 3×3 neighborhood image area of an input image and input weighting values and the product sum $\Sigma A_{ijmn} Y_{mn}$ of output image values of a small number of pixels in a 3×3 neighborhood image area of an output image and output weighting values are added.

The resulting sum is obtained for each of the colors R (red), G(green), B (blue) and W (white) is entered into an output image determination unit.

The sums of the products of the input images and output images for respective ones of the color entries enter the output determination unit, which proceeds to decide the output image.

A specific configuration will now be described as a this embodiment of the invention.

Figure 2:
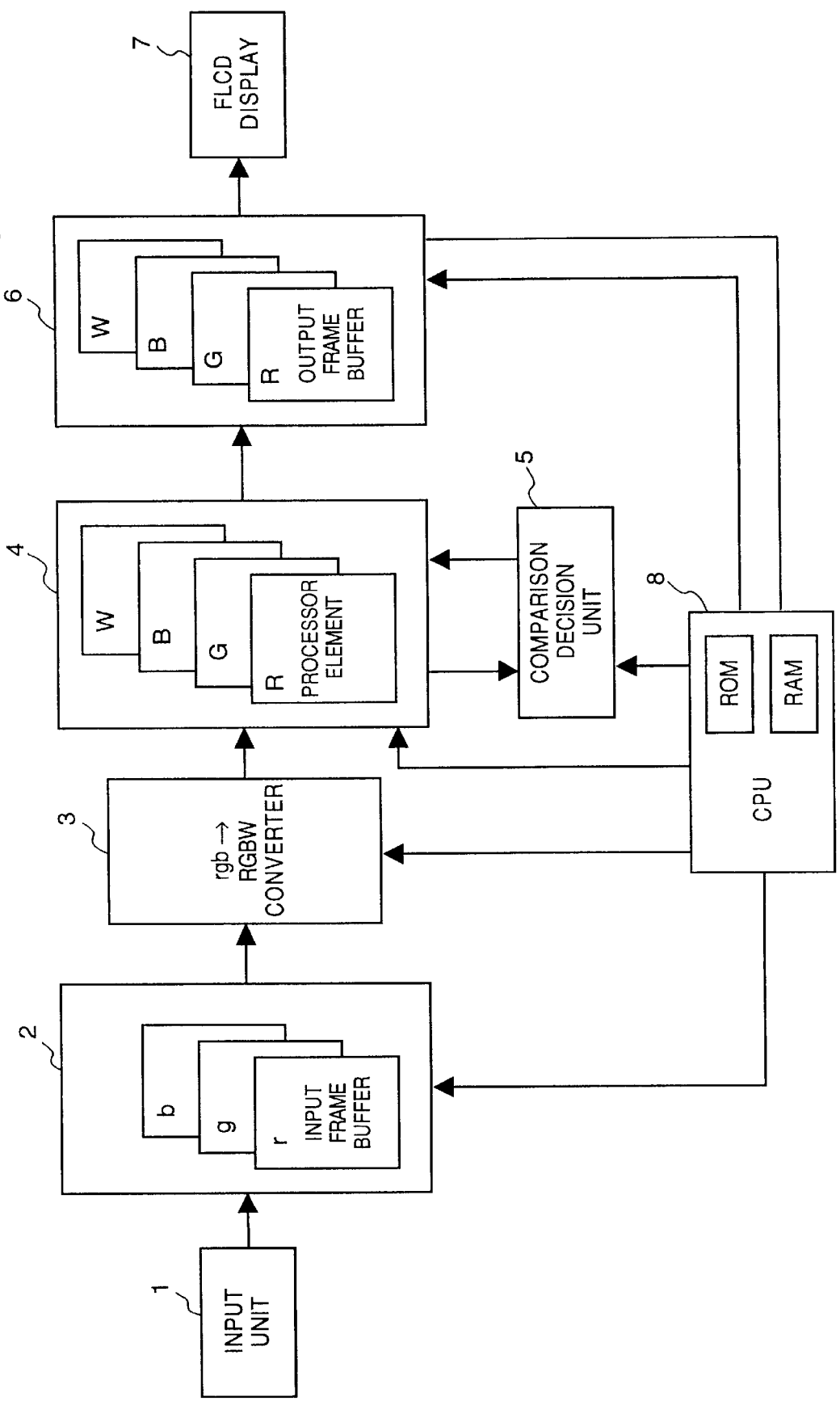
FIG. 2 is a block diagram illustrating the configuration of a display system internally incorporating a digital image processor according to this embodiment.

FIG. 2 is a block diagram illustrating the configuration of a display system internally incorporating a digital image processor according to this embodiment of the invention.

Shown in FIG. 2 is an image input unit 1 for entering a color-tone image comprising a plurality of bits per pixel. By way of example, the image input unit is constituted by a digital camera, scanner and computer to which data composed of eight bits for each of r, g and b pixels. An input frame buffer 2 temporarily stores at least a plurality of lines of image data for each color. Here a multiply-and-accumulate operation is executed in a 5×5 area of the input image when the output data of a pixel of interest are decided. As a result, at least five lines of data are temporarily stored for each of the colors.

An rgb→RGBW converter 3 converts the r, g, b data of one pixel stored in the frame buffer 2 to R, G, B, W (white) data capable of being handled by FLCD, described later. Here the rgb data are first clipped to the color of an area capable of being displayed by FLCD, and then the clipped rgb data are converted to RGBW data.

Figure 3:
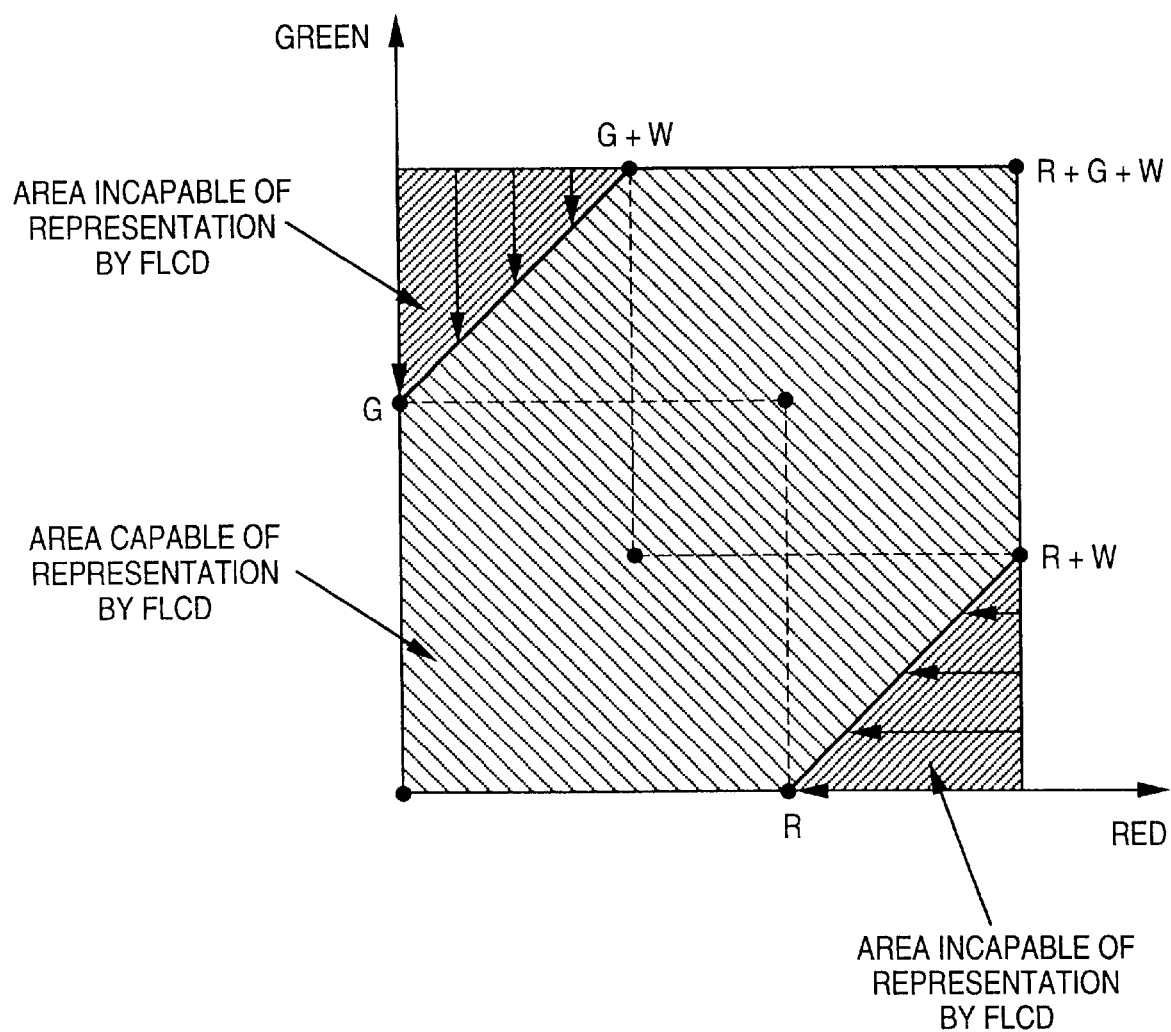
FIG. 3 is a diagram for describing clipping processing.

FIG. 3 is a diagram for describing clipping processing Ideally, the color of the square area of FIG. 3, which indicates an area capable of being represented by the colors R, G, B of an FLCD, exists in R, G, W space. However, since the space at the upper left and the space at the lower right cannot be represented on an FLCD, rgb data, which would be converted to the area in which representation would be impossible, are first converted to rgb data capable of being represented on the FLCD. The conversion is executed as indicated by the following expressions:

if r > min(b,g) + 0.24706
 then r = min(b,g) + 0.24706
if g > min(r,b) + 0.24706
 then g = min(r,b) + 0.24706
if b > min(r,g) + 0.24706
 then b = min(r,g) + 0.24706

Next, the rgb data thus clipped are converted to RGBW data in accordance with the following equations:

W=min(r,g,b)

R=1.60377·r−0.60377·W

G=1.60377·g−0.60377·W

B=1.60377·b−0.60377·W

With reference again to FIG. 2, numeral 4 denotes an image processing unit comprising an R processor element, a G processor element, a B processor element and a W processor element. On the basis of the algorithm of a DTCNN, each processor element adds the product sum ΣAijmnYmn of input image data and input weighting values and the product sum ΣBijmnUmn of output image data and output weighting values, as illustrated in FIG. 1, and outputs the resulting sum. Upon taking into account the input image and output image of a predetermined area, the image processing unit 4 outputs data, which are as faithful to the input image as possible, as the result of the multiply-and-accumulate operations, these data being delivered as data indicative of the pixel of interest. Further, the image processing unit 4 outputs bi-level RGBW data, which have been sent from the comparison decision unit 5, to an output frame buffer 6. The image processing unit 4 will be described below in further detail.

Numeral 5 denotes a comparison decision unit which effects the conversion to the bi-level R, G, B, W data based upon the multivalued R, G, B, W data, which are the results of the multiply-and-accumulate operations, sent from the R processor element, G processor element, B processor element and W processor element. The bi-level data are sent to the image processing unit for the purpose of processing and output. The details of the comparison decision unit 5 will be described later.

An output frame buffer 6 stores quantized bi-level image data for each of the colors R, G, B and W.

Numeral 7 denotes a ferroelectric liquid crystal display (FLCD). Each single pixel of this display is composed of four subpixels, namely R, G, B and W subpixels.

A CPU 8, which is connected to the input frame buffer 2, rgb→RGBW converter 3, image processing unit 4, comparison decision unit 5 and output frame buffer 6, performs address control for data transfer and control of image processing, etc. The CPU 8 is provided with a ROM storing a control program and a RAM serving as a work area.

Figure 4:
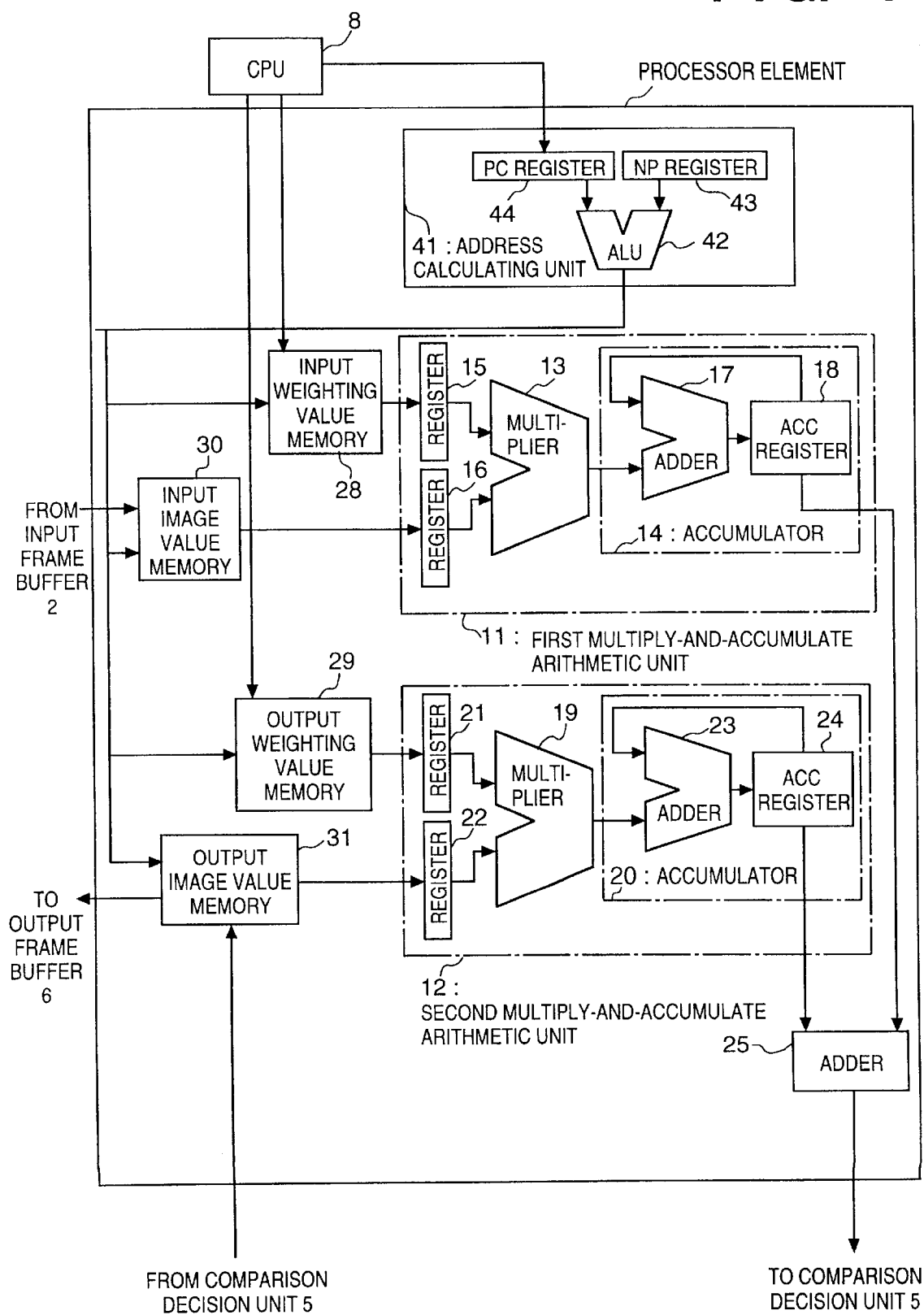
FIG. 4 is a block diagram showing the details of a processor element.

FIG. 4 is a block diagram showing the details of one processor element in the image processing unit 4. The four processor elements each consist of the circuitry shown in FIG. 4.

The processor element includes a memory 30 for storing a color-tone image that resides in a neighborhood image area composed of a plurality of pixels sent from the input frame buffer 2, a memory 28 for storing each weighing value in the neighborhood image area, a memory 31 for storing an output halftone image of a small number of bits in a neighborhood image area, a memory 29 for storing output weighting values, and an address calculating unit 41 which calculates address values for accessing the memories 28, 29, 30 and 31. The address calculating unit 41 comprises an ALU 42, an NPC register 43 and a PC register 44.

A plurality of weighting values are stored in each of the memories 28, 29. The quality of the output image can be selected by selecting the weighting values. In order to make the selection, the CPU 8 judges a signal supplied by a selecting unit (not shown) and sends the memories 28, 29 a command which specifies the selection of the weighting values.

The processor element further includes a first multiply-and-accumulate arithmetic unit 11 for calculating the product sum ΣBijmnUmn of data in the memory 28 storing the input weighting values in the neighborhood image area and the data in the memory 30 storing the input color-tone image. The first multiply-and-accumulate arithmetic unit 11 comprises a multiplier 13, an accumulator 14 and registers 15, 16.

The registers 15, 16 latch the input color-tone image U and the weighting value B fetched from the memories 28, 30, respectively. The accumulator 14 includes an adder 17 and an ACC register 18.

The processor element further includes a second multiply-and-accumulate arithmetic unit 12 for calculating the product sum ΣAijmnYmn of data in the memory 29 storing the output weighting values and data in the memory 31 storing the output halftone image. The second multiply-and-accumulate arithmetic unit 12 comprises a multiplier 19, an accumulator 20 and registers 21, 22.

The registers 22, 21 latch the output halftone image Y and weighting value A fetched from the memories 31, 29, respectively.

The accumulator 20 includes an adder 23 and an ACC register 24.

The registers 18, 24, 25, 43 and 44 in the processor element perform the functions described below.

The PC register 44 stores the address of a pixel to be processed in accordance with a command from the CPU 8. The NPC register 43 stores the image position of a neighborhood system.

As for the values stored in the NPC register 43, values from (−2,−2) to (2,2) are stored, as shown in FIG. 5, assuming that the neighborhood system used in processing has a maximum size of 5×5. For this reason the register incorporates an incrementer that is capable of updating these values.

When the operation for multiplying and accumulating weighting values A in the neighborhood system and output halftone images Y is performed, the addresses of the neighborhood pixels are calculated from the values in the NPC register 43 and PC register 44, and these pixel values are fetched.

The ACC register 18 accumulates the results of convoluting the pixel of interest and its neighborhood system in the first multiply-and-accumulate arithmetic unit 11. The ACC register 24 accumulates the results of performing a convolution relating to the neighborhood system of the pixel of interest in the second multiply-and-accumulate arithmetic unit 12.

The address calculating unit 41 calculates addresses values from the NPC register 43 and PC register 44.

The processor element further includes an adder 25 for adding the operational results from the first multiply-and-accumulate arithmetic unit 11 and the operational results from the second multiply-and-accumulate arithmetic unit 12.

The results of the addition performed by the adder 25 are sent to the comparison decision unit 5. The results of binarizing the pixel of interest are sent to the processor element from the comparison decision unit 5, and here the results are stored in the output image value memory 31. This value is sent to the second multiply-and-accumulate arithmetic unit 12 and to the output frame buffer 6.

FIG. 6 illustrates an example of weighting values that have been stored in the output weighting value memory 29, and FIG. 7 illustrates an example of weighting values that have been stored in the input weighting value memory 28. These output weighting values and input weighting values controls the image quality of the output halftone image. By storing a plurality of these weighting values in memory and making it possible to select them, the image quality of the output image can be selected.

The operation of the comparison decision unit 5 will now be described with reference to FIG. 8.

Figure 8:
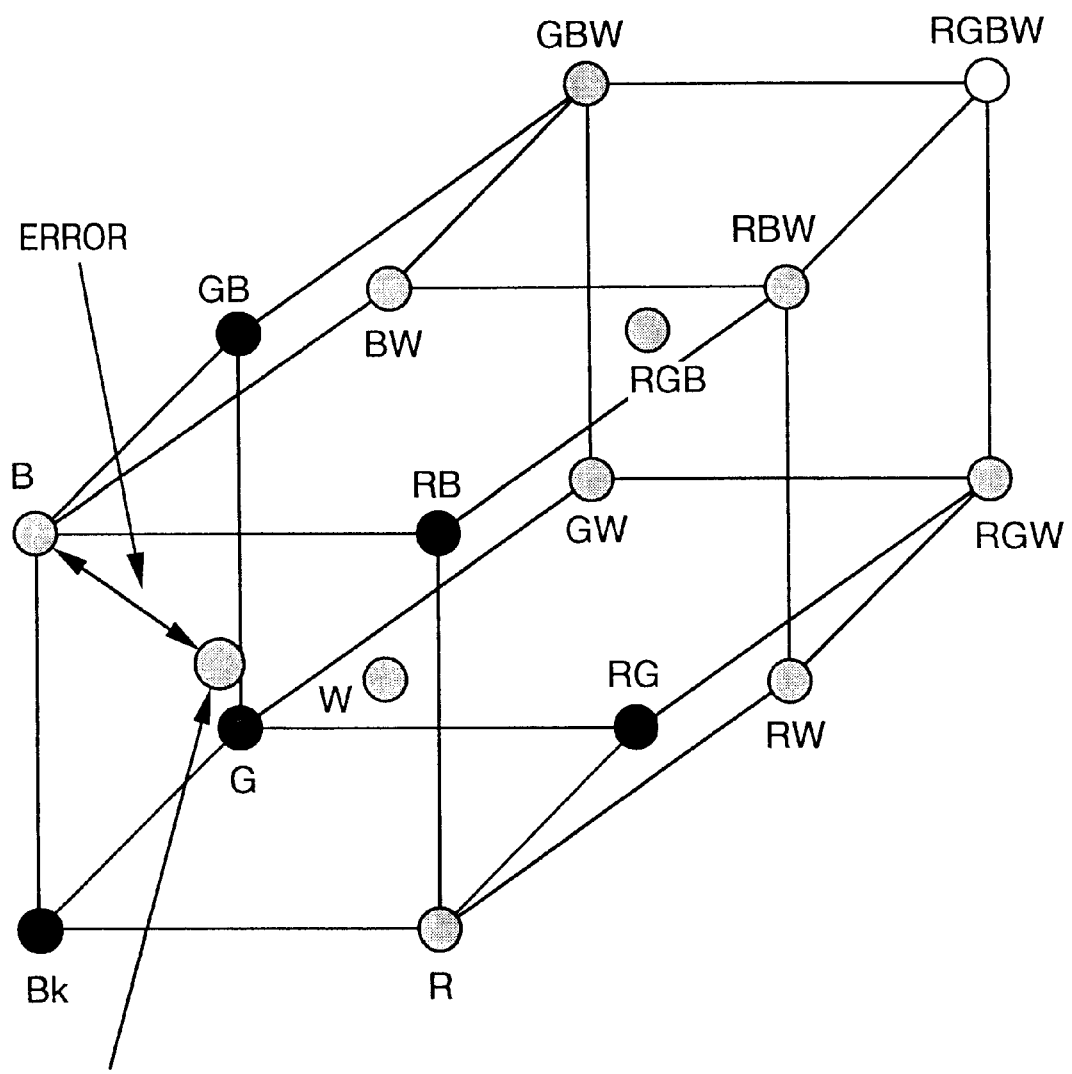
FIG. 8 is a diagram for describing three-dimensional quantization processing in a comparison decision unit.

The vertices of regular hexahedrons in FIG. 8, namely the 16 vertices Bk, R, RG, GB, RB, RBW, BW, W, RW, RGW, GW, BW, RBW, RGBW and GBW, are coordinates of colors in rgb space capable of being displayed by a combination of subpixels of RGBW of FLCD. Accordingly, the comparison decision unit 5 converts the output RGBW data from each adder 25 of the four processor elements to rgb data, finds the distances (errors) between the rgb data and the 16 vertices in FIG. 8 and decides upon the vertex that gives the smallest error as being the output data.

Figure 9:
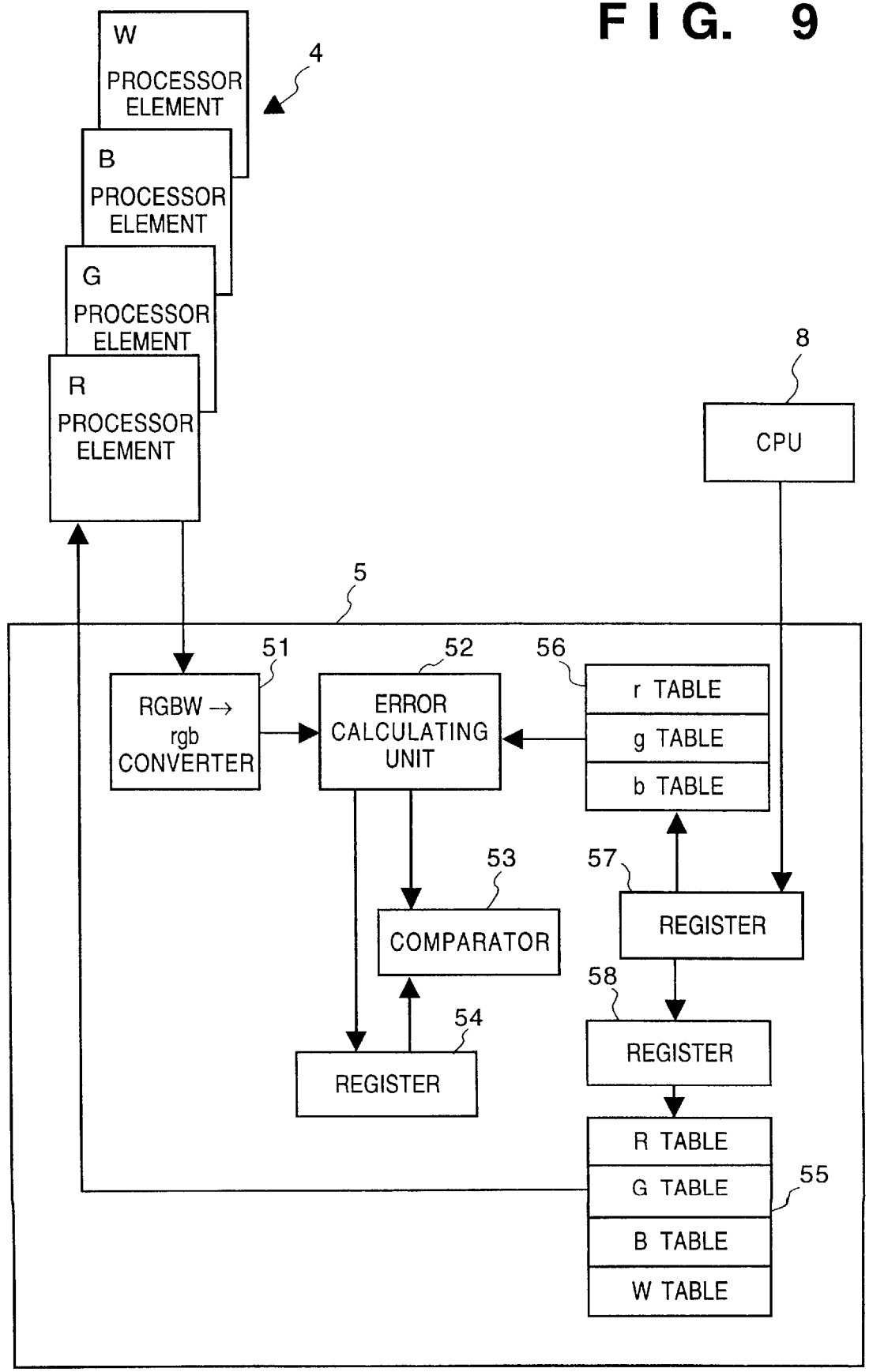
FIG. 9 is a diagram for describing the details of the comparison decision unit.

FIG. 9 is a block diagram illustrating the details of the comparison decision unit 5.

The comparison decision unit 5 includes an RGBW→rgb converter 51 the inputs to which are the RGBW outputs from the adders 25 in each of the processor elements for the colors RGBW.

The RGBW→rgb converter 51 converts the RGBW to rgb data on the basis of the following equations:

$$r = 0.62353R + 0.37647W$$

$$g = 0.62353G + 0.37647W$$

$$b = 0.62353B + 0.37647W$$

An error calculating unit 52 calculates the error between the output of an rgb table 56 and the output of the RGBW→rgb converter 51. A comparator 53 compares the output of a register 54 and the output of the error calculating unit 52. The register 54 is for storing the value of the smallest error. When the output of the error calculating unit 52 is smaller than the value in the register 54, the value in the register 54 is updated by the output of the error calculating unit 52.

The rgb table 56 stores the coordinates of the vertices of FIG. 8 as values illustrated in FIG. 10. A register 57 designates the content of the rgb table 56. A register 58 stores the number of the vertex having the smallest error. When the output of the error calculating unit 52 is smaller than the value in the register 54, the value in the register 58 is updated by the output of the register 57.

An RGBW table 55 stores the values of RGBW of each vertex in FIG. 8 in the manner shown in FIG. 11. The outputs of the RGBW table 55 are the values of RGBW of the vertex having the smallest error specified by the register 58. These values are sent to the respective processor elements.

In FIG. 11, −1.0 indicates that the subpixel of the display device is extinguished, and 1.0 indicates lighting of the subpixel.

The operation of the comparison decision unit shown in FIG. 9 will now be described.

First, the CPU 8 sets No. 0 in the register 57. When this is done, the rgb table 56 sends the r, g, b data of No. 0 shown in FIG. 10 to the error computing unit 52. The error computing unit 52 calculates the error between the rgb data from the rgb table 56 and the rgb data from the RGBW→rgb converter 51. The comparator 53 compares this error value with the value that has been stored in the register 54. Since a sufficiently large value (the maximum value) has been stored as the initial value in the register 54, the comparator 53 judges that the value from the error computing unit 52 is small. In this case, the value from the error computing unit 52 is stored in the register 54 and the value (No. 0 in this case) in register 57 is set in the register 58.

This processing is repeated until the No. in register 57 becomes 15.

At the moment this processing ends, the RGBW data corresponding to the No. that has been stored in the register 58 from FIG. 11 are sent to the processor elements of each of R, G, B and W on the basis of the No. that has been stored in the register 58. Each processor sends this result to the output frame buffer 6. If this is different from the data that have already been stored, then the value is rewritten to a new value. Though this completes a single conversion processing cycle for a conversion to bi-level RGBW data of one pixel, this processing is executed with regard to all input pixels. When the processing for all input pixels ends, the CPU 8 counts the values of data that have been rewritten in the four output frame buffers for R, G, B, W. In a case where the number of rewritten values is 0, it is judged that the arithmetic operations based upon the neural network have converged. The values prevailing in the output frame buffers at the time of convergence are sent to the FLCD. It should be noted that if the total number of values rewritten in the four output frame buffers is less than a predetermined value, the processing based upon the neural network is brought to an end and the output value is decided, thereby making it possible to perform processing at high speed.

Figure 12:
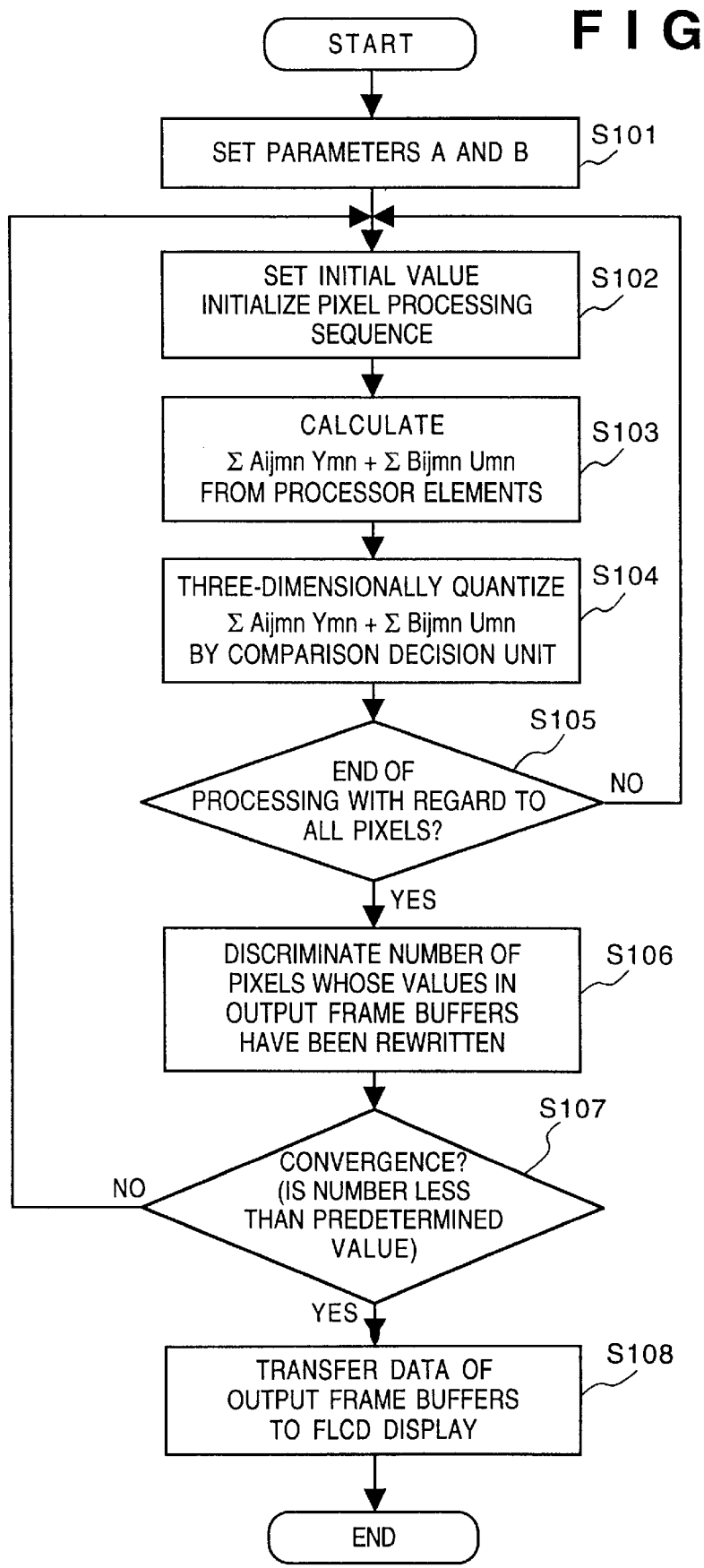
FIG. 12 is a control flowchart according to this embodiment.

FIG. 12 is an operation control flowchart according to this embodiment and will be referred to in order to described control. The processing of this flowchart is executed by the CPU 8.

An output weighting value (parameter A) and an input weighting value (parameter B), which are used in the processor elements, are set at step S101. The parameters A and B used are those shown in FIGS. 6 and 7, by way of example. An arrangement may be adopted in which any parameter can be selected from a respective one of a plurality of parameters.

An initial value is set in the output frame buffer 6 at step S102. Here random bi-level data are set in the output frame buffer. Further, when the multiply-and-accumulate operation is executed with respect to the input data of all pixels of one frame, the sequence of this operation is set at step S102. The sequence of this operation is given an order such that all pixels will be randomly scanned.

At step S103 a command is issued to the four processor elements based upon the order decided at step S102, and the operation $\Sigma A_{ijmn}Y_{mn} + \Sigma B_{ijmn}U_{mn}$ is executed.

A command is sent to the comparison decision unit 5 and three-dimensional quantization (the determination of the binary value of RGBW) is carried out based upon the data indicating the results of multiply-and-accumulate sent from the four processor elements at step S104. These results are sent to the four output frame buffers. If the values are different from those already stored, then the values are rewritten.

It is determined at step S105 whether the processing of all entered pixels has ended. If this processing has not ended, the program proceeds to step S103. Here the pixel of interest is changed, based upon the pixel processing sequence set randomly at step S102, and the multiply-and-accumulate operation is executed.

If it is determined at step S105 that the processing of all pixels has ended, then the program proceeds to step S106, where the numbers of pixels rewritten in the four output frame buffers 4 are discriminated.

It is determined at step S107 whether the number of pixels discriminated at step S106 is less than a predetermined value. If the number is less than the predetermined value, then it is judged that the operation based upon the neural network has converged, and the program proceeds to step S108. Here one screen of data in each of the four output frame buffers 4 are sent to the FLCD. Further, if it is found at step S107 that the number of pixels discriminated at step S106 is greater than the predetermined value, then the processing of steps S103~S107 is repeated.

Another embodiment of the invention will now be described.

Figure 13:
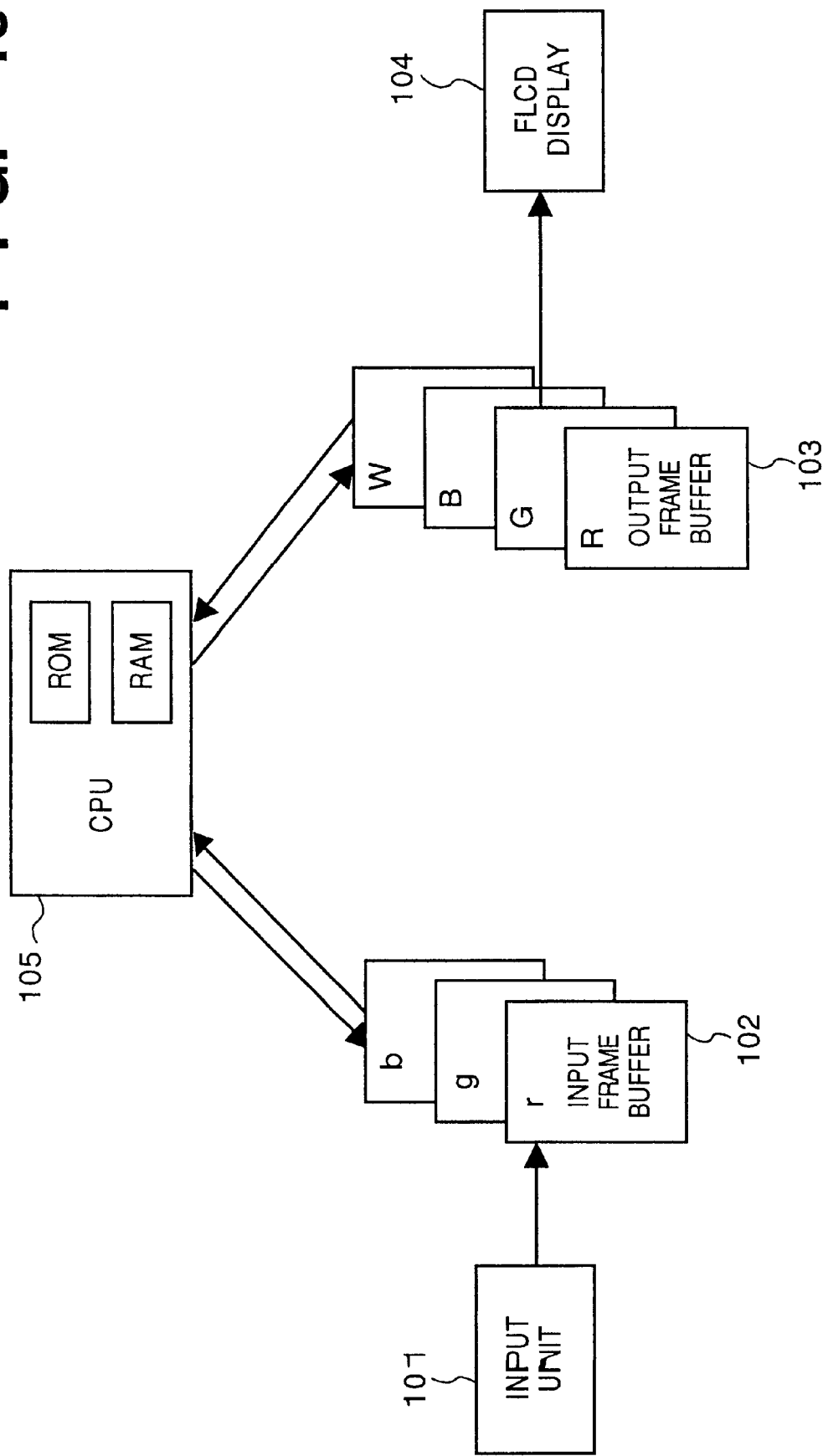
FIG. 13 is a block diagram illustrating a display system according to another embodiment of the invention.

FIG. 13 is a block diagram illustrating the configuration of another embodiment of the invention. Shown at 101 is an image input unit for entering a full-color image comprising a plurality of bits per pixel. The image input unit 101 comprises a camera, a scanner and a computer, by way of example.

An input frame buffer 102 temporarily stores image data of at least a plurality of lines as shading data of each of the r, g and b components. An output frame buffer 103 stores bi-level image data obtained by quantizing each of R, G, B and W. A ferroelectric liquid crystal display (FLCD) 104 in which each pixel is composed of the four subpixels of R, G, B and W. A CPU 105 performs address control for data transfer as well as the operations of a cellular neural network. The CPU 105 is provided with a ROM storing processing content and a RAM serving as a work area.

Figure 14:
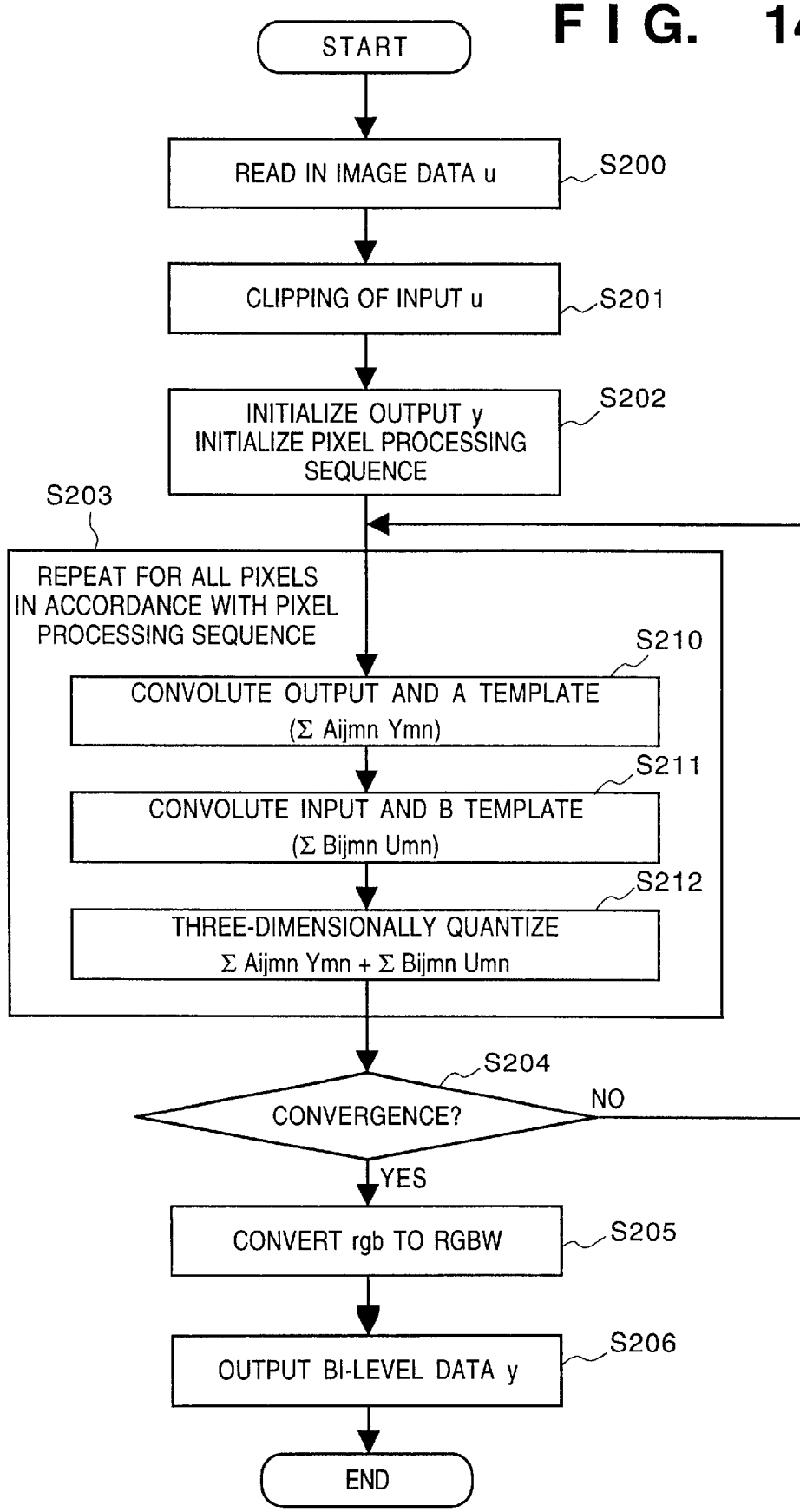
FIG. 14 is a control flowchart of processing executed by a CPU in FIG. 13.

FIG. 14 is a flowchart showing the processing executed by the CPU 105.

Image data u are read in to the input frame buffer 102 from the input unit 101 at step S200 in FIG. 14. Next, the values of pixels having colors in an area incapable of being represented by RGBW in FLCD are clipped at step S201 to an area in which representation is possible. The output of each neuron of r, g, b (the contents of the output frame buffers) is initialized by a random number and the processing sequence within one frame also is initialized by a random number at step S202. A multiply-and-accumulate operation is performed with regard to each pixel of interest at step S203, which is composed of steps S210, S211 and S212.

Step S204 is a step for judging neuron convergence. For example, it is judged that convergence has been achieved if the number of changes in the state of a neuron (the number of pixels for which there has been a change from the preceding bi-level output) is less than a predetermined value.

Figure 15:
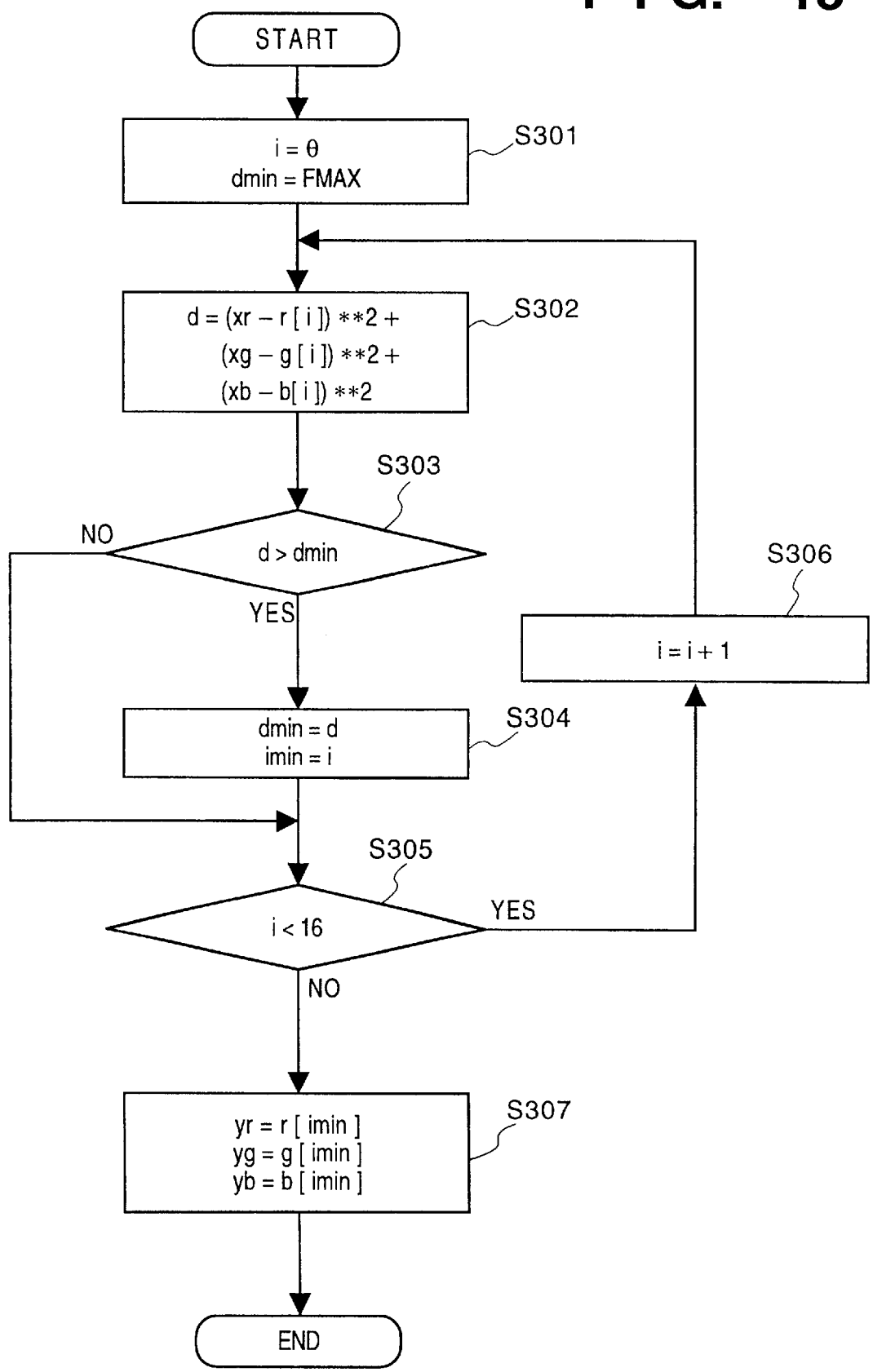
FIG. 15 is a control flowchart showing the details of a step S212 in FIG. 14.

A conversion from rgb to RGBW is performed at step S205. Each of the RGBW values is obtained by multiplying each of the rgb values by coefficients and then summing the products on the basis of the equations set forth above. The RGBW bi-level data are outputted to the output frame buffer 103 at step S206. The multiply-and-accumulate operation $\Sigma A_{ijmn} Y_{mn}$ is applied to the output halftone image and the A template shown in FIG. 6 at step S210. The multiply-and-accumulate operation $\Sigma B_{ijmn} U_{mn}$ is applied to the input and the B template shown in FIG. 7 at step S211. Three-dimensional quantization of $\Sigma A_{ijmn} Y_{mn} + \Sigma B_{ijmn} U_{mn}$ is carried out at step S212. The flowchart of three-dimensional quantization is illustrated in FIG. 15.

A counter i for repetition is set to 0 and a sufficiently large value FMAX is set as a variable dmin at step S301. Next, a square error d of the ith value of the rgb table and the value of $\Sigma A_{ijmn} Y_{mn} + \Sigma B_{ijmn} U_{mn}$ is obtained at step S302. The square error is defined as the sum of the squares of the differences of each of the components r, g, b.

Next, dmin and d are compared at step S303, the program proceeds to step S304 if d<dmin holds and to step S305 otherwise. The error d is substituted for dmin and i is substituted for min at step S304.

The counter i determines at step S305 whether the above processing has been repeated 16 times. If repetition has not ended, i is incremented and the program proceeds to step S302.

The values of rgb at the vertex for which the error is smallest are obtained at step S307.

Thus, in accordance with this embodiment as described above, entered multivalued color image data (rgb) are converted to bi-level color data (R, G, B, W) based upon the algorithm of a neural network. As a result, an output color image faithful to the input color image can be obtained. The color image has a quality much better than that obtained with the conventional dither method or error diffusion method.

Moreover, in accordance with this embodiment, the neural network is constructed of digital circuitry, as shown in FIGS. 4 and 9. This makes it possible to provide a color image processing apparatus which excels in universality, ease of control and ease of integration.

Though the embodiments have been described with regard to an example in which input rgb data are converted to RGBW data capable of being displayed on FLCD, the invention is applicable also to other display systems and to electrophotographic digital color printers and inkjet color printers.

FIG. 16 is a diagram in which a color image processor using a neural network in accordance with this embodiment of the invention is applied to a color printer.

The arrangement of FIGS. 16 differs from that of FIG. 2 in that the input rgb data are converted to YMCK data used in a printer and processing is executed based upon a neural network.

Thus, in accordance with the present invention as described above, input multivalued image data are converted to output color image data based upon the algorithm of a neural network. This makes it possible to obtain a high-quality output color image that is faithful to an input color image.

As many apparently widely different embodiments of the present invention can be made without departing from the spirit and scope thereof, it is to be understood that the invention is not limited to the specific embodiments thereof except as defined in the appended claims.

What is claimed is:

1. An image processing apparatus comprising:

input means for entering a plurality of color image signals;

processing means for subjecting the entered color image signals to processing based upon an algorithm of a cellular neural network;

quantization means for deciding output color data by using halftoning processing based upon results of processing by said processing means; and output means for outputting a color image based upon results of quantization by said quantization means, wherein said processing means further comprises:
first multiply-and-accumulate processing means for digitally processing multiplication and accumulation of input color image data of a plurality of pixels and input weighing values in a predetermined area; and
second multiply-and-accumulate processing means for digitally processing multiplication and accumulation of output color data of a plurality of pixels and output weighting values in a predetermined area,
wherein said second multiply-and-accumulate processing means performs processing by using the output color data decided by said quantization means.

2. The apparatus according to claim 1, further comprising control means for causing processing in said processing means and quantization processing in said quantization means to be repeatedly executed, until a state of convergence is obtained, while results of quantization in said quantization means are fed back to said processing means, and determining upon results of quantization, which results prevail, when the state of convergence has been obtained, as output color data.

3. An image processing method comprising:

an input step of entering a plurality of color image signals;

a processing step of subjecting the entered color image signals to processing based upon an algorithm of a cellular neural network;

a quantization step of deciding output color data by using halftoning processing based upon results of processing by said processing step; and an output step of outputting a color image based upon results of quantization by said quantization step, wherein said processing step further comprises:

a first multiply-and-accumulate processing step of digitally processing multiplication and accumulation of input color image data of a plurality of pixels and input weighing values in a predetermined area; and a second multiply-and-accumulate processing step of digitally processing multiplication and accumulation of ouptut color data of a plurality of pixels and output weighting values in a predetermined area, wherein said second multiply-and-accumulate processing step performs processing by using the output color data decided by said quantization step.

* * * * *

UNITED STATES PATENT AND TRADEMARK OFFICE
CERTIFICATE OF CORRECTION

PATENT NO. : 5,995,669
DATED : November 30, 1999
INVENTOR(S) : TOSHIAKI SHINGU ET AL.

It is certified that error appears in the above-identified patent and that said Letters Patent is hereby corrected as shown below:

ON THE COVER PAGE:

Under Column [73], after Assignee, insert:

--[*] Notice: This patent issued on a continued prosecution application filed under 37 CFR 1.53(d), and is subject to the twenty year patent term provisions of 35 U.S.C. 154(a)(2).--

COLUMN 3

Line 20, "image)" should read --image).--;
    Line 21, "." should be deleted; and
    Line 35, "(FLCD," should read "(FLCD),--.

COLUMN 4

Line 12, "as a" should read --as--; and
    Line 35, "processing" should read --processing.--.

COLUMN 5

Line 36, "consist" should read --consists--.

UNITED STATES PATENT AND TRADEMARK OFFICE
CERTIFICATE OF CORRECTION

PATENT NO.    : 5,995,669
DATED         : November 30, 1999
INVENTOR(S)   : TOSHIAKI SHINGU ET AL.

It is certified that error appears in the above-identified patent and that said Letters Patent is hereby corrected as shown below:

COLUMN 6

Line 56, "controls" should read --control--.

COLUMN 8

Line 16, "described" should read --describe--.

Signed and Sealed this

Twenty-fourth Day of April, 2001

Attest:

NICHOLAS P. GODICI

Attesting Officer

Acting Director of the United States Patent and Trademark Office